United States Patent [19]
Rostoker et al.

[11] Patent Number: 5,567,655
[45] Date of Patent: Oct. 22, 1996

[54] METHOD FOR FORMING INTERIOR BOND PADS HAVING ZIG-ZAG LINEAR ARRANGEMENT

[75] Inventors: Michael D. Rostoker, San Jose; Nicholas F. Pasch, Pacifica; Joe Zelayeta, Saratoga, all of Calif.

[73] Assignee: LSI Logic Corporation, Milpitas, Calif.

[21] Appl. No.: 469,086

[22] Filed: Jun. 5, 1995

Related U.S. Application Data

[63] Continuation of Ser. No. 58,347, May 5, 1993, abandoned.

[51] Int. Cl.$^6$ .................................................. H01L 21/60
[52] U.S. Cl. ............................ 437/209; 437/206; 437/217; 437/220; 257/666; 257/692; 257/737; 257/779; 257/780
[58] Field of Search ............................ 437/206, 209, 437/220, 217; 257/666, 692, 737, 779, 780

[56] References Cited

U.S. PATENT DOCUMENTS

| | | | |
|---|---|---|---|
| 3,429,040 | 2/1969 | Miller | 29/626 |
| 3,811,186 | 5/1974 | Larnerd et al. | 29/626 |
| 3,871,014 | 3/1975 | King et al. | 357/67 |
| 3,984,860 | 10/1976 | Logue | 357/68 |
| 4,190,855 | 2/1980 | Inoue | 357/80 |
| 4,701,999 | 10/1987 | Palmer | 437/211 |
| 4,772,936 | 9/1988 | Reding et al. | 357/80 |
| 4,774,635 | 9/1988 | Greenberg et al. | 361/421 |
| 4,803,546 | 2/1989 | Sugimoto et al. | 357/81 |
| 4,825,284 | 4/1989 | Soga et al. | 357/80 |
| 4,894,704 | 1/1990 | Endo | 357/70 |
| 4,897,602 | 1/1990 | Lin et al. | 324/158 F |
| 4,916,519 | 4/1990 | Ward | 357/70 |
| 4,926,241 | 5/1990 | Carey | 357/75 |
| 4,970,575 | 11/1990 | Soga et al. | 357/72 |
| 5,051,813 | 9/1991 | Schneider et al. | 357/72 |
| 5,068,712 | 11/1991 | Murakami et al. | 357/72 |
| 5,086,018 | 2/1992 | Conru et al. | 437/220 |
| 5,227,661 | 7/1993 | Heinen | 257/669 |
| 5,358,904 | 10/1994 | Murakami et al. | 437/209 |
| 5,384,487 | 1/1995 | Rostoker et al. | 257/786 |
| 5,453,583 | 9/1995 | Rostoker et al. | 174/267 |

FOREIGN PATENT DOCUMENTS

| | | |
|---|---|---|
| 61-145838(A) | 7/1986 | Japan . |
| 4348045 | 12/1992 | Japan ............ 437/220 |

OTHER PUBLICATIONS

"LED Array Modules by New Technology Microbump Bonding Method", by Hatada et al., IEEE Transactions on Comp., Hybrids, and Manuf. Tech., vol. 13, No. 3, pp. 521–527, Sep. 1990.

R Tummala, et al. "Microelectronics . . . Handbook", Van Nostrand Reinhold, 1989, pp. 366–367.

*Primary Examiner*—George Fourson
*Assistant Examiner*—Long Pham
*Attorney, Agent, or Firm*—Katz & Cotton, LLP

[57] ABSTRACT

A technique for reducing thermally-induced mechanical stresses on bond pads in semiconductor device assemblies is accomplished by grouping (laying out) the bond pads in two parallel rows, approximately centered about a central axis of the die. Further, the bond pads of one row are axially offset from the bond pads of the other row, thereby forming a two-row zig-zag linear configuration of bond pads. The "axis" is a line preferably passing through a thermal centroid of the die. By keeping the bond pad layout close to the axis, lateral thermally-induced displacements of the bond pads relative to the axis can be minimized and controlled. Longitudinal (axial) displacements of the bond pads are accommodated by flexing, rather than compression, of conductive lines (such as leadframe fingers) connecting to the bond pads and entering the die perpendicular to the axis. By providing a staggered double-row configuration, a larger number of bond pads may be accommodated than could be accommodated in a single row, linear configuration of bond pads.

12 Claims, 1 Drawing Sheet

METHOD FOR FORMING INTERIOR BOND PADS HAVING ZIG-ZAG LINEAR ARRANGEMENT

This application is a continuation of application Ser. No. 08/058,347, filed May 5, 1993 entitled "Zig-Zag Linear Arrangement for Interior Bond Pads," by Michael D. Rostoker, Nicholas F. Pasch, and Joe Zelayeta, now abandoned.

TECHNICAL FIELD OF THE INVENTION

The invention relates to integrated circuit fabrication techniques, and more particularly to techniques for forming electrical connections with an integrated circuit die.

BACKGROUND OF THE INVENTION

As used herein, the term "semiconductor device" refers to a silicon chip or die containing circuitry, and the term "semiconductor device package" refers to the semiconductor device and associated packaging containing the chip, including leads such as for connecting to a socket or a circuit board, and internal connections, such as bond wires or solder bump (e.g., micro-bump) connections, of the chip to the leads.

In a typical modern semiconductor device package, a semiconductor die (device) is disposed within a package and is connected to conductive leads of the semiconductor device package by means of bond wires or "solder bump" (micro-bump) connections. The connections to the semiconductor die are typically accomplished via metallic connection points or "bond pads" (I/O pads) disposed on a planar surface of the die, around the periphery (along the edges) thereof in a "peripheral area". The peripheral area is a ring-shaped area on the surface of the die, essentially a narrow band between the edges of the die and an "interior area" of the die. The conductive leads of the semiconductor device package may be provided by a leadframe, such as in a molded plastic or TAB (Tape Automated Bonding) semiconductor device package, or by printed traces, such as in a ceramic or overmolded printed circuit board package, or other suitable substrate. The conductive leads approach the semiconductor die within the semiconductor device package in a generally radial ("fan-in") pattern, or in parallel ranks extending across one or more edges of the die.

Typically, a leadframe is stamped (or etched) from a sheet of conductive material, simultaneously forming all of the conductive leads of the leadframe. Often, the leadframe is held together by sacrificial "bridges" between the leads, which are removed after the leadframe is assembled to a die and a package body is formed. The leads are then effectively separate. However, by virtue of their common mounting within a package body, they continue to behave as a unit, in certain regards.

As the circuitry on a die operates, it dissipates power and heats up. Often, there is a mismatch between the thermal coefficients of expansion (TCE) of a semiconductor die and the leadframe (and package body) to which it is attached. This is especially troublesome where solder bump (micro-bump) connections are used to connect the die to the leadframe. (It is assumed that the heating of the die as it operates is fairly uniform). The die expands about its "centroid" (center of mass) as temperature rises, as do the leadframe and package body. However, the die expands at a different rate than the leadframe and package body, causing a great deal of mechanical stress at the interface between the leadframe and the bond pads (the solder bump connections). This stress creates a tendency of the bond pads to tear away from the die, resulting in a failed device.

On any thermally expanding body, the further a point on the body is from the centroid, the greater the absolute distance it travels (displaces) during expansion. Since semiconductor dies are typically rectangularly shaped and the bond pads are typically disposed along the edges of the rectangular shape (in the peripheral area), the bond pads undergo a fairly large absolute displacement as compared to points located closer to the center (centroid) of the die. Any bond pads located at the corners of the die, being furthest from the centroid, undergo the greatest displacement during thermal expansion. As a consequence of the absolute thermal displacements that any two different points undergo on the surface of the die, they undergo differential thermal displacements relative to one another. The further from one another that any two points on the surface of an expanding die are, the greater the differential thermal displacement between them. The leadframe and package body combination also expands about its centroid, albeit at a different rate. The center of expansion of the leadframe/package body combination is generally located fairly close to the centroid of the die, since the die is the heat source which causes the expansion. As a result, any differential thermal displacement causing mechanical stress at the bond pads of a semiconductor device is greatest at the corners of the die. The common practice of disposing bond pads along the edges of the die, therefore, would seem to create the worst possible circumstances from the point of view of thermal expansion.

Although the thermal expansion problem is most severe with micro-bump (solder bump) connections to a relatively rigid leadframe assembly, the same expansion characteristics apply to the die and leadframe/package body even if bond wires are used to connect the bond pads on the die to the leadframe. Although bond wires tend to be considerably more flexible and resilient than lead frame leads, thermal flexing of bond wire connections can create long-term reliability problems.

One of the most common and compelling reasons that bond pads are typically disposed about the edges (periphery) of a die is that such a peripheral location permits a relatively large number of I/O connections to the die without causing the connections to cross one another. Current trends are towards providing smaller bond pads so that even greater numbers of I/O connections to the die may be accommodated. Unfortunately, the smaller connections (i.e., bond pads) are even more fragile than "ordinary" (larger) size connections, making such techniques even more prone to thermal stress problems.

Another problem with locating bond pads along the periphery of a die is that many of the connections are made to circuitry that lies well within the interior of the die, requiring that the signals from that circuitry travel a relatively great distance within the die along the die's minute wiring structures (e.g., metal lines) before they reach the bond pad connection. Hence, a "pad buffer" circuit is usually provided at or near a bond pad associated with an output signal to buffer the output signal at the bond pad. The length of conductive lines within the die can contribute to timing "skew", or differences in signal timing due to different wiring delays, particularly for very high speed circuits. The conductive lines within a die are extremely small and exhibit some non-trivial resistance. Even a tiny bond wire is a massive conductor compared to the relatively tiny conductive lines on a die.

Attention is directed to the following U.S. patents, incorporated herein by reference, and of general interest with respect to leadframe-type semiconductor device packages and techniques for the manufacture thereof: U.S. Pat. No. 4,701,999 issued Oct. 27, 1987 to Palmer, U.S. Pat. No. 4,774,635 issued Sep. 27, 1988 to Greenberg et al., U.S. Pat. No. 4,894,704 issued Jan. 16, 1990 to Endo, U.S. Pat. No. 4,897,602 issued Jan. 30, 1990 to Lin et al., and U.S. Pat. No. 5,051,813 issued Sep. 24, 1991 to Schneider et al.

Attention is further directed to the following U.S. patents, incorporated herein by reference, and of general interest with respect to micro-bump (e.g., solder bump) bonding: U.S. Pat. No. 3,429,040 issued Feb. 25, 1969 to Miller, U.S. Pat. No. 3,811,186 issued May 21, 1974 to Larnerd et al., U.S. Pat. No. 3,871,014 issued Mar. 11, 1975 to King et al., U.S. Pat. No. 3,984,860 issued Oct. 5, 1976 to Logue, U.S. Pat. No. 4,190,855 issued Feb. 26, 1980 to Inoue, U.S. Pat. No. 4,772,936 issued Sep. 20, 1988 to Reding et al., U.S. Pat. No. 4,803,546 issued Feb. 7, 1989 to Sugimoto et al., U.S. Pat. No. 4,825,284 issued Apr. 25, 1989 to Soga et al., U.S. Pat. No. 4,926,241 issued May 15, 1990 to Carey, and U.S. Pat. No. 4,970,575 issued Nov. 13, 1990 to Soga et al.

Additional information relating to microbump bonding techniques may be found in Japanese Patent number 61-145838A issued on Jul. 3, 1986 to Kishio Yokouchi, and in "LED Array Modules by New Technology Microbump Bonding Method," by Hatada, Fujimoto, Ochi, and Ishida, IEEE Trans. Comp., Hybrids, and Manuf. Tech., Volume 13 no. 3, Sept. 1990, incorporated by reference herein.

DISCLOSURE OF THE INVENTION

It is therefore an object of the present invention to provide a technique for minimizing thermally created stresses at bond pad interfaces to semiconductor dies.

It is a further object of the present invention to provide a technique for minimizing the absolute thermal displacement of bond pads on a semiconductor die.

It is a further object of the present invention to minimize differential thermal displacements between bond pads on a semiconductor die.

It is a further object of the present invention, in concert with the foregoing objects, to maximize the number of bond pads which may be disposed on the surface of the die.

It is a further object of the present invention to provide novel techniques for connecting to semiconductor dies.

Hereinafter, the planar surface area of a semiconductor die in the immediate vicinity of the edges of the die will be referred to as the "peripheral area", and bond pads disposed in this peripheral area will be referred to as "peripheral bond pads". Also, the planar surface area of the die located inside of (surrounded by) the peripheral area will be referred to as the "interior area" of the die, and bond pads disposed within the "interior area" will be referred to as "interior bond pads".

According to the invention, it is posited that differential thermal displacements between points on a body due to thermal expansion of the body are proportional to the distance between the points. It is further posited that the absolute thermal displacement of a point on a body relative to the thermal center of expansion is proportional to the distance between the point and the thermal center of expansion. Also, if two bodies have different thermal coefficients of expansion and are thermally coupled at a point near their respective centroids, then differential thermal displacement and absolute thermal displacements between points on the different bodies will behave similarly, albeit on a different scale (depending on the various coefficients of thermal expansion of the two bodies).

Further, according to the invention, it is posited that leadframe fingers and/or bond wires are considerably stiffer relative to end displacement in a longitudinal direction (along their length) than to end displacement in a lateral direction (perpendicular to their length). Therefore, according to the invention, lateral thermal displacements of the ends of bond wires or leadframe fingers due to differential expansion create less mechanical stress on bond pad interfaces than do longitudinal thermal displacements.

Accordingly, the present invention seeks to place bond pads close to an "axis" of a semiconductor die. The "axis" is an imaginary line which passes over (or substantially close to) the centroid (center of mass and/or center of thermal expansion) of the die. Since the axis lies over the centroid of the die, bond pads placed close to the axis experience little lateral thermal displacement (i.e., perpendicular to the axis). Such near-axis bond pads do, however, displace thermally along the length (longitudinally along) the axis, especially those furthest from the center of the die. Since bond wires and/or leadframe fingers will approach the bond pads from a direction substantially perpendicular to the axis, this longitudinal thermal displacement of bond pads along the axis translates to lateral end displacement of the bond wires and/or leadframe fingers and is reasonably well accommodated. Since lateral displacement of the bond pads relative to the axis is minimal, longitudinal end displacements of the leadframe fingers and/or bond wires are correspondingly small.

By providing bond pads in two staggered rows, near the central axis, the pad-to-pad spacing constraints are eased, and a large number of bond pads may be accommodated (as compared to a single row configuration of bond pads) by increasing effective "linear" bond pad density.

In one embodiment of the invention, a zig-zag pattern of bond pads is laid out on a semiconductor die by providing a semiconductor die, defining an axis passing over (or substantially close to) the centroid of the semiconductor die. A first limit line is defined, parallel to the axis and a first distance away from the axis, on one side of the axis. A second limit line is defined of the opposite side of the axis, also parallel to the axis and spaced away from the axis a second distance.

A first row of bond pads, preferably regularly-spaced, is disposed in the interior area of the die, as defined hereinabove. The first row of bond pads is parallel to the axis, and spaced away from the axis between the axis and the first limit line.

A second row of (preferably) regularly-spaced bond pads is disposed in the interior area of the die. Like the first row, the second row is also parallel to the axis. The second row is spaced away from the axis between the axis and the second limit line. The bond pads in the second row are preferably offset longitudinally (along the length of the row, or axis) from the bond pads in the first row such that a zig-zag, staggered pattern of bond pads is formed by the two rows.

According to various aspects of the present invention, the first and second distances (of the first and second limit lines to the axis) are 10%, 15%, 20%, 25%, and 30% of the width of the die as measured perpendicular to the axis.

Other embodiments of the invention are directed to semiconductor dies formed according to the inventive technique described hereinabove.

Further, according to the invention, if circuits on a semiconductor die are located distant from the desired "interior" bond pad locations (i.e., signals originate outside the small, closed area where it is sought to locate the bond pads), existing and/or extra wiring (metallization) layers may be employed to provide connection between these circuits and bond pads at the desired locations. This is particularly useful in applying the present inventive technique to semiconductor dies which were originally laid out (designed) for bond pads in the peripheral area. Existing and/or additional wiring layers may be employed to route signals from the original (designed) bond pad positions to the desired (according to the inventive technique) interior bond pad positions.

Other objects, features and advantages of the invention will become apparent in light of the following description thereof.

DETAILED DESCRIPTION OF THE INVENTION

Figure 1:
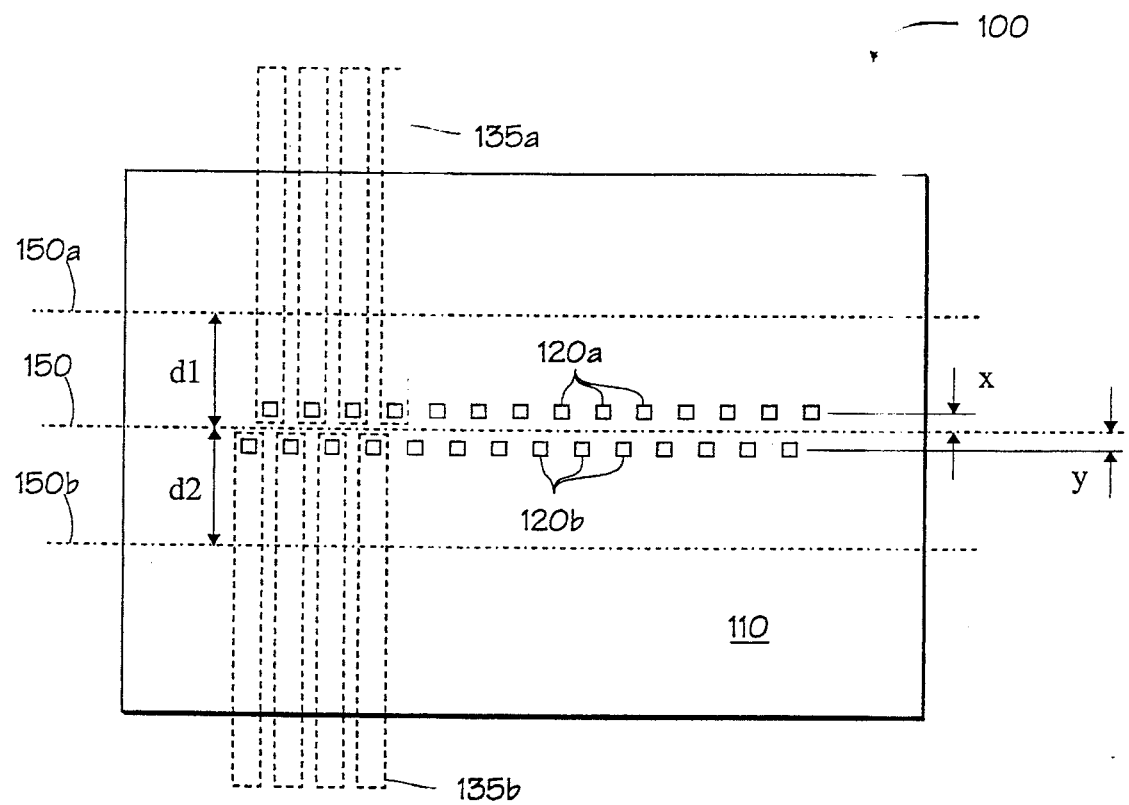
FIG. 1 is a top (plan) view of semiconductor die with a zig-zag linear arrangement of interior bond pads, according to the invention.

According to the invention, it is posited that if an array of bond pads on a semiconductor die is tightly (closely) grouped (arranged or clustered), then the amount of differential thermal expansion between those bond pads will be correspondingly small, and that if the small array of bond pads is located close to the centroid of the die, then the absolute thermal displacement of the bond pads will be correspondingly small. With respect to the present invention, it is apparent that if bond pads are laid out in a row (one dimensional line) near the centroid of the die, then the thermally-induced migration of the bond pads can effectively be constrained substantially in one controlled direction (i.e., along the line).

Similarly, if the ends of the conductive leads of a mounted leadframe form a small (tightly clustered) pattern, the differential thermal displacement of the ends of the leads will be correspondingly small. Also, if the small pattern formed by the ends of the conductive leads is located close to the center of expansion of the leadframe, then the absolute thermal displacement of the ends of the conductive leads will be correspondingly small. According to the invention, these principles may be used to surprising (and somewhat non-intuitive) advantage in the design packaging of semiconductor dies.

While the industry trend is largely towards increasing the number of connections to a semiconductor die, certain types of semiconductor devices, despite great complexity, do not require large numbers of I/O connections. An example of an I/O non-intensive type of semiconductor device is any type of memory device (e.g., ROMs, RAMs, including dynamic RAM and static RAM, etc.) Memory devices are highly repetitive arrays of circuitry with a relatively small number of I/O connections thereto. In cases such as these, there is no compelling need to employ the large bond pad capacity of the periphery of the die. In fact, according to the invention, it is extremely advantageous (from a thermal expansion point of view) to locate the bond pads in a relatively small array, preferably, but not necessarily, towards the centroid of the die—in any case away from the periphery of the die.

Leadframe fingers and, to a lesser degree, bond wires are stiffest (most rigid and unbending) along their length, since any displacement of the end of the leadframe finger or bond wire tends to put it in compression (or tension). Although bond wires are considerably more tolerant of any kind of end displacement than are leadframe fingers, the path of bond wires is typically kept fairly flat (i.e., there is typically no significant "loft" or high arc in the path of the bond wire), resulting in a certain amount of stiffness along the length of the bond wires (longitudinally) because of the tendency of end motion in a flat configuration to put the bond wire in compression until an arc is formed. (Also, a bond wire is significantly more unyielding in tension than in flex.) This relatively flat bond wire configuration is used to minimize the possibility of short-circuits between adjacent bond wires. However, bond wires and leadframe fingers are considerably more tolerant of lateral displacement (flexing) of their ends since the lateral displacement tends to be distributed more-or-less evenly along the entire length of the leadframe finger or bond wire (i.e., there is some sideways "springiness" of bond wires and leadframe fingers).

According to the present invention, a linear (or zig-zag, as discussed hereinbelow) bond pad arrangement along a longitudinally oriented centerline of a semiconductor die with bond wires or leadframe fingers approaching the line of bond pads perpendicularly to their linear axis benefits from the relatively high degree of flexibility of the leadframe fingers (or bond wires) as contrasted to the relative incompressibility of the leadframe fingers or bond pads. That is, an arrangement of bond pads in a straight line along a path through (or over) the centroid of a semiconductor die will experience little or no lateral (relative to the line of bond pads, longitudinal relative to the bond wires or leadframe fingers) thermal displacement of bond pads. This straight line is referred to hereinafter as an "axis" of the die.

However, a simple, single, linear arrangement of bond pads unduly limits the number of connections which can be formed with the die.

According to the present invention, two (or more, two discussed herein) rows of bond pads are disposed in an interior area of a semiconductor die. The rows of bond pads are preferably parallel to one another, and are preferably approximately centered about a central axis of the die. Also, the pads in one row are preferably offset axially (longitudinally staggered) from one another, in which case corresponding leadframe fingers approaching each row of bond pads are also offset from one another.

The two rows of bond pads are spaced close to the axis, compared to peripheral area bond pad placements, so that lateral thermal displacements of the bond pads relative to the axis are kept relatively small, thereby minimizing thermally induced stresses on the bond pads once the die is assemble to a leadframe or other package assembly. Providing two rows of bond pads effectively doubles the number of bond pads which may be disposed on the die over the number of bond pads that could otherwise be accommodated with a single, linear arrangement of bond pads, without exacerbating thermally-induced stress problems.

FIG. 1 is a top view of a semiconductor die 100 with a zig-zag linear bond pad arrangement, according to an exemplary embodiment of the invention. An axis 150 is defined on a planar surface 110 of the die 100. The axis passes through (over) the centroid of the die. (The axis may also be offset from the exact centerline of the die.)

A first limit line 150a is defined on the surface 110 of the die 100 at a distance of "d1" away from the axis 150, and is preferably parallel to the axis. The first limit line 150a is offset to one side (top, as viewed in the figure) of the axis.

A second limit line 150b is defined on the surface 110 of the die 100 at a distance of "d2" away from the axis 150, and is also preferably parallel to the axis (as well as being preferably parallel to the first limit line 150*a*). The second limit line 150*b* is offset to another, opposite side (bottom, as viewed in the figure) of the axis.

As will be evident, two rows of interior bond pads are disposed in an interior area of the die, between the first and the second limit lines, which interior area includes the centroid of the die.

A first plurality of bond pads 120*a* is disposed in a first regularly-spaced row, parallel to and spaced a first distance "x" away from the axis 150 on one side of the axis (i.e., the bond pads 120*a* are disposed on the same side of the axis as the first limit line 150*a*). A second plurality of bond pads 120*b* is disposed in a second regularly-spaced row, parallel to the axis, and spaced a second distance "y" away from the axis on the opposite side of the axis 150 (i.e., the bond pads 120*b* are disposed on the same side of the axis 150 as the second limit line 150*b*).

Each bond pad 120*a*/120*b* has a longitudinal (axial) coordinate, which can be determined by dropping a perpendicular line from a given bond pad to the axis 150. Each bond pad also has a lateral coordinate, which is essentially its distance from the axis. Evidently, if the bond pads 120*a* are laid out in a line parallel to the axis 150, the lateral coordinates of all of the bond pads 120*a* is the same (in this case, "x"). Likewise, if the bond pads 120*b* are laid out in a line parallel to the axis 150, the lateral coordinates of all of the bond pads 120*b* is the same (in this case, "y").

Preferably, but not necessarily, the bond pads of a given row (i.e., the bond pads 120*a*) are evenly (regularly) spaced apart from one another. In other words, they have a constant increment in their longitudinal coordinate (as measured from any given point along the line upon which they lie.

Preferably, but not necessarily, the two rows of regularly-spaced bond pads 120*a* and 120*b* are offset from one another such that a zig-zag, staggered configuration is formed. In other words, the longitudinal coordinates of the bond pads 120*a* fall in between (or bisect) the longitudinal coordinates of the bond pads 120*b*.

According to the invention, the two rows of bond pads 120*a* and 120*b* are advertently disposed between the limit lines 150*a* and 150*b*, respectively, such that "x" (the lateral offset of the bond pads 120*a* from the axis 150) is less than or equal to "d1" (the lateral distance of the limit line 150*a* from the axis), and such that "y" (the lateral offset of the bond pads 120*b* from the axis 150) is less than or equal to "d2" (the lateral distance of the limit line 150*b* from the axis).

In order to constrain the area in which the bond pads may be disposed (i.e., their desired locations), so that thermally-induced stresses resulting from attachment (connection) to a leadframe are minimized (or, at least controlled), the distances "d1" and "d2" defining the bond pad area are a distance equal to, for example, 5%, 15%, 20%, 25% or 30% of the lateral (widthwise, top-to-bottom as viewed in the figure) distance across the die 100 as measured perpendicular to the axis 150. The bond pads 120*a* and 120*b* are all disposed within this constrained interior area of the die, as defined hereinabove. Preferably, but not necessarily, the distances "d1" and "d2" are equal (and opposite with respect to the axis 150).

The lateral offset of the bond pads 120*a* and 120*b* from the axis, "x" and "y", respectively, is sufficient that the bond pads (which are extremely small areas, not points) do not overlap each other. Assuming that a bond pad can be treated (for purposes of this discussion) as a "point", the offsets "x" and "y" are preferably on the order of 5%, 10%, 15%, 20%, 25% or 30% of the width of the die (30% being the limiting case where a bond pad is on the corresponding limit line).

Representative leadframe fingers 135*a* and 135*b*, shown as dashed lines (only a few of many are illustrated in the figure), extend from outside the area of the die 100 in a direction perpendicular to the axis across the surface 110 of the die and over (at least onto) corresponding ones of the bond pads 120*a* and 120*b*. A first set of leadframe fingers 135*a* extend from one edge (top, as viewed in the figure) of the die to the bond pads 120*a* located on that side of the axis. A second set of leadframe fingers 135*b* extend from another opposite edge (bottom, as viewed in the figure) of the die to the bond pads 120*b* located on that side of the axis. This avoids any unnecessary crossovers of leadframe fingers.

As is evident in the figure, the longitudinal coordinates of the leadframe fingers (vis-a-vis the axis of the die) are such that the first set of leadframe fingers 135*a* are longitudinally offset from the second set of leadframe fingers 135*b*. The longitudinal coordinates of the leadframe fingers correspond to the longitudinal coordinates of the bond pads to which they are intended to connect.

Typically, an electrical connection is formed between each of the bond pad fingers 135*a* and 135*b* and a corresponding one of the bond pads 120*a* and 120*b*, respectively, via a micro-bump (solder bump) connection. Bond wires, rather than leadframe fingers, can also be used to form connections to the bond pads.

Connections between circuits in the die (not shown) and bond pads (both being on the die) may be accomplished by means of either existing or additional wiring layers, either within the die (under the surface of the die) or on the surface of the die. This is particularly advantageous in circumstances where either:

a) the design of the circuitry on the die was optimized (designed) for bond pad placement at the periphery of the die, and re-routing of existing signals is necessary to apply the present inventive techniques; or b) the circuitry on the die cannot be laid out optimally for the desired interior bond pad locations (of the present invention) and it is necessary to route signals to bond pads from relatively distant positions on the die.

It is within the spirit and scope of the present invention that the present inventive technique may be employed using solder bump connections, bond wires, or other suitable means of forming connections to bond pads. Further, these techniques may be applied to raised bump mounting to printed traces on printed circuit substrates (e.g., FR4, BT resin, etc.), or to other substrates, in a flip-chip configuration. Such printed circuit boards often have a thermal coefficient of expansion significantly different from that of silicon. Evidently, interior bond pads can be used to great advantage in these circumstances.

What is claimed is:

1. Method of interconnecting densely packed bond pads on a semiconductor die with leadframe fingers, comprising:

providing a semiconductor die having a planar surface;

defining on the planar surface a thermal centroid axis passing substantially over a thermal centroid of the semiconductor die, the die having a width perpendicular to the axis;

defining on the planar surface a first limit line parallel to and on a first side of the thermal centroid axis and near the thermal centroid axis at a first distance;

defining on the planar surface a second limit line parallel to and on a second side of the thermal centroid axis and near the thermal centroid axis at a second distance;

the first and second distances are each less than 30% of the width of the die;

disposing a first plurality of bond pads in a first row adjacent to the first limit line and between the first limit line and the thermal centroid axis;

disposing a second plurality of bond pads in a second row adjacent to the second limit line and between the second limit line and the thermal centroid axis;

connecting a first set of leadframe fingers to the first plurality of bond pads with solder bump connections; and connecting a second set of leadframe fingers to the second plurality of bond pads with solder bump connections, wherein the first set of leadframe fingers are longitudinally offset from the second set of leadframe fingers.

2. Method, according to claim 1, wherein:

the first and second distances are substantially equal.

3. Method, according to claim 1, wherein:

the die has a width perpendicular to the axis;

the first distance is 5% of the width of the die.

4. Method, according to claim 1, wherein:

the die has a width perpendicular to the axis;

the second distance is 5% of the width of the die.

5. Method, according to claim 1, wherein:

the die has a width perpendicular to the axis;

the first and second distances are each less than 10% of the width of the die.

6. Method, according to claim 1, wherein:

the die has a width perpendicular to the axis;

the first and second distances are each less than 15% of the width of the die.

7. Method, according to claim 1, wherein:

the die has a width perpendicular to the axis;

the first and second distances are each less than 20% of the width of the die.

8. Method, according to claim 1, wherein:

the die has a width perpendicular to the axis;

the first and second distances are each less than 25% of the width of the die.

9. Method, according to claim 1, wherein:

the first plurality of bond pads each have an associated longitudinal coordinate as determined by their position in the axial direction;

the second plurality of bond pads each have an associated longitudinal coordinate as determined by their position in the axial direction;

the longitudinal positions of bond pads in the first plurality of bond pads are such that the bond pads in the first plurality of bond pads are evenly spaced from one another.

10. Method, according to claim 1, wherein:

the first plurality of bond pads each have an associated longitudinal coordinate as determined by their position in the axial direction;

the second plurality of bond pads each have an associated longitudinal coordinate as determined by their position in the axial direction;

the longitudinal positions of bond pads in the second plurality of bond pads are such that the bond pads in the second plurality of bond pads are evenly spaced from one another.

11. Method, according to claim 1, wherein:

the first plurality of bond pads each have an associated longitudinal coordinate as determined by their position in the axial direction;

the second plurality of bond pads each have an associated longitudinal coordinate as determined by their position in the axial direction;

the longitudinal positions of the bond pads in the second plurality of bond pads are such that the bond pads in the second plurality of bond pads are disposed at longitudinal positions which fall in between the longitudinal positions of the bond pads in the first plurality of bond pads.

12. Method, according to claim 11 wherein:

the longitudinal positions of the bond pads in the second plurality of bond pads substantially bisect the longitudinal positions of the bond pads in the first plurality of bond pads, thereby configuring the two pluralities in a linear zig-zag configuration.

* * * * *